June 18, 1957 I. GOLDSTEIN 2,796,586

IMPEDANCE MATCHED COUPLING DEVICE

Filed June 4, 1953 2 Sheets-Sheet 1

INVENTOR
IRVING GOLDSTEIN
BY Elmer J. Gorn
ATTORNEY

IMPEDANCE MATCHED COUPLING DEVICE

Filed June 4, 1953 2 Sheets-Sheet 2

INVENTOR
IRVING GOLDSTEIN
BY Elmer J. Gorn
ATTORNEY

United States Patent Office 2,796,586 Patented June 18, 1957

2,796,586

IMPEDANCE MATCHED COUPLING DEVICE

Irving Goldstein, Worcester, Mass., assignor to Raytheon Manufacturing Company, Newton, Mass., a corporation of Delaware Application June 4, 1953, Serial No. 359,536

4 Claims. (Cl. 333—33)

This invention pertains to a coaxial mixer, and more particularly relates to a coaxial mixer whose injector portion contains an energy-absorptive load for improving the impedance match in said mixer.

One form of prior adjustable high frequency coaxial line mixer utilizes a local oscillator injector which includes a first transmission line, one end of which is connected to an R. F. source or a TR cavity and the other end of which contains a mixer crystal. The injector also comprises a transmission line tuning stub mounted normal to the main transmission line and containing a tuning probe positioned in energy coupling relationship with said main transmission line. The tuning stub in turn contains a branch transmission line which is connected to the local oscillator. By changing the position of the tuning probe, it is possible to vary the amount of local oscillator energy fed into the crystal connected in said first transmission line.

It is desirable in such devices that the point of insertion of the local oscillator energy to the main transmission line be at an open circuit in order to transmit the local oscillator energy to the injector output. In broad band mixers of the above type, however, the portion of the transmission line between the injection point and the R. F. source at certain frequencies becomes some multiple of a half-wave length long and the end of this portion of the line then acts as an open circuit with consequently undesirable reflection of energy and a high standing wave ratio. When the TR cavity at the end of the line is shorted, a short will appear at the local oscillator injection point one-half wave length removed and practically none of the local oscillator energy will be transmitted to the mixer crystal.

In accordance with this invention, one end of the aforesaid first transmission line is closed and contains an energy absorptive load. The other end of this transmission line is connected to a coaxial hybrid ring; the R. F. output from the TR cavity is also connected to said hybrid ring. If a balanced mixer is desired, the hybrid ring has two output branches containing crystal rectifiers. This invention is equally applicable, however, to a simple mixer using a single rectifying means.

Because of the energy absorptive termination load positioned at the end of one of the injector arms, a satisfactory impedance match between the hybrid network and the local oscillator is achieved over a considerable frequency band and the standing wave ratio in the local oscillator injector line is reduced. Any energy which may be reflected from the hybrid network, owing to a mismatch between said network and the injector portion of the mixer assembly, is absorbed in the energy absorptive termination.

A better understanding of this invention may be had by reference to the following description taken in conjunction with the accompanying drawings in which.

Figure 1:
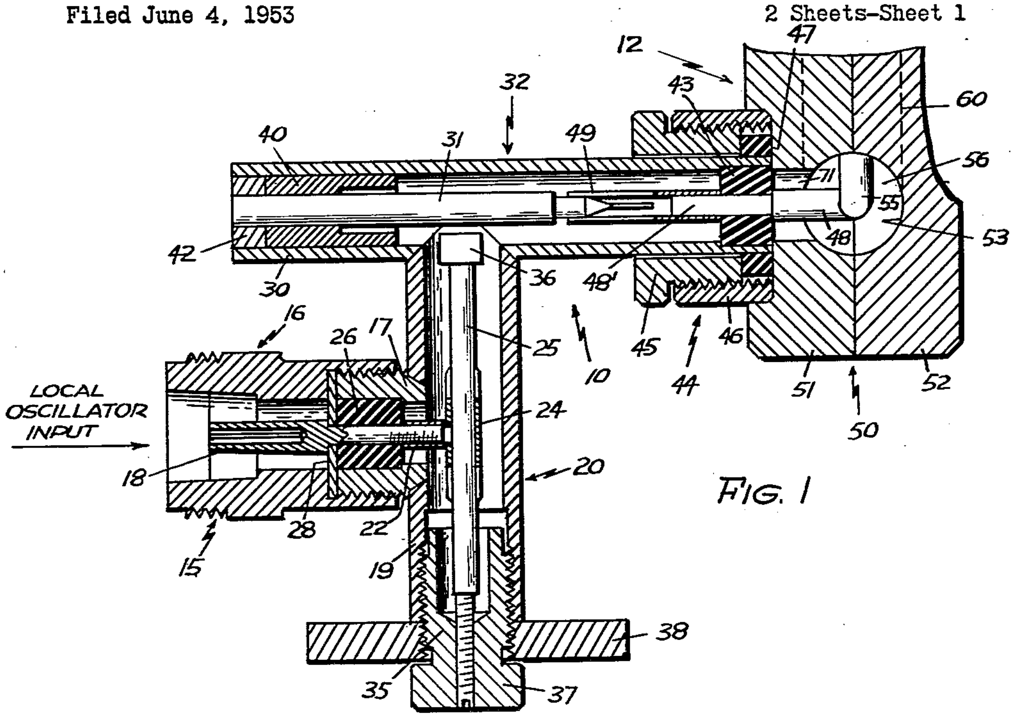
Fig. 1 is a central cross-sectional view of the local oscillator injector portion of a coaxial mixer assembly.
Figure 2:
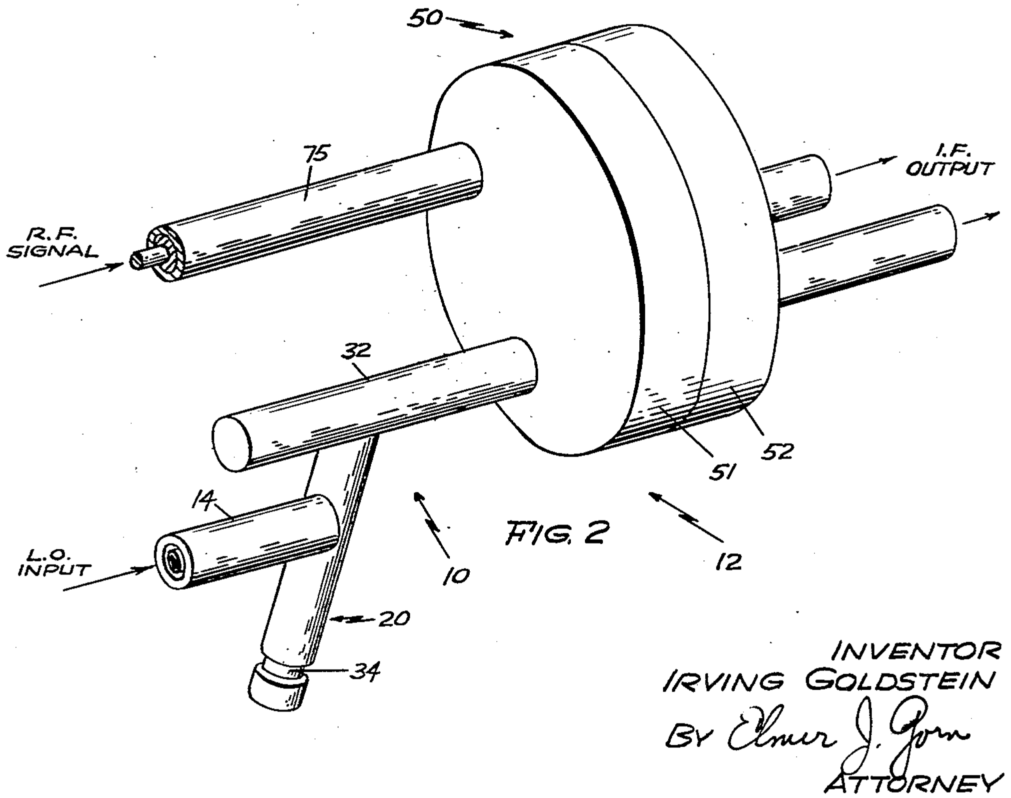
Fig. 2 illustrates the basic external arrangement of a typical coaxial mixer assembly in which the coaxial line connectors have been omitted for the sake of simplicity.

Referring to the drawing, the local oscillator injector portion 10 of the coaxial mixer assembly 12 is shown in cross section in Fig. 1. Energy from a local oscillator is applied over a coaxial transmission line 14 (see Figs. 2 and 3) which terminates in a coaxial connector 15 (Fig. 1).

The connector is shown, by way of example, as including a first cylindrical member 16 threadedly connected to a second cylindrical member 17 which, together, form the outer conductor of the connector. One end of member 17 of connector 15 is fixedly attached, as by soft soldering, to the outer conductor 19 of a coaxial line stub 20. One end of inner conductor 18 of connector 15 is threadedly inserted into an internally threaded portion 22 of sleeve 24 surrounding inner conductor 25 of stub 20. The inner conductor 18 of connector 15 is supported by an insulating bead 26. A toroidal fifty-ohm resistive disk 28 is mounted about inner conductor 18 with the plane of the disk normal to the axis of the coaxial line and is held securely between the outer end of member 17 and a shoulder portion on member 16 when members 16 and 17 are screwed together. The resistive disk is shunted across an open circuit point in the local oscillator line 14. This resistive disk is preferably located a half-wave length or an odd multiple of half wave lengths from the local oscillator injection point adjacent probe 36, which itself becomes substantially an open circuit point. The impedance at this point is therefore fifty ohms. Resistive disk 28, by way of example, may comprise a Bakelite disk having annular areas adjacent each of the coaxial line conductors plated with silver and the annular region between the two silvered areas coated with carbon. The resistance between the inner and outer silvered areas is about fifty ohms. The construction of resistive disk 28 may, however, vary from that just described. Moreover, the value of resistance of the resistive disk is dependent upon the characteristic impedance of the line connected to the local oscillator.

The outer conductor 19 of stub line 20 is joined with the outer conductor 30 of coaxial transmission line 32. As shown in Fig. 1, stub line 20 is arranged normal to both local oscillator input connector 15 and line 32; however, a 90 degree angular relationship between the various coaxial lines need not necessarily be maintained. The inner conductor 25 of line 20 which extends through sleeve 24 is fastened at one end to a tuning plug 35 which, in turn, threadedly engages the end of outer conductor 19 remote from line 32, as well as a mounting plate 38. The free end of inner conductor 25 terminates in an enlarged discoidal end portion or probe 36 which extends into transmission line 32 in spaced relation with inner conductor 31 of line 32 and provides capacitive coupling between the local oscillator and the hybrid ring network, to be described later. By turning the head portion 37 of tuning plug 35, the position of probe 36 with respect to inner conductor 31 of line 32, and, hence, the amount of electromagnetic energy transferred between coaxial lines 14 and 32, may be varied. The position of the probe may also be varied by means of a threaded portion at one end of inner conductor 25 which cooperates with the tuning plug 35.

The distance between the shorted end of stub line 20 and the junction of inner conductors 18 and 25 is a quarter wave length or any odd multiple of the quarter wave length at the operating frequency in order to maintain said junction at an open circuit.

A first branch of line 32 contains an energy absorptive load in the form of a cylindrical attenuator 40. Cylinder 40 is preferably made of polyiron which has the advantage of having a very large attenuation constant, particularly at microwave frequencies, and an impedance which is relatively independent of wave length. It is, of course, possible for the coaxial line termination 40 to be of any material or configuration which will satisfy the requirements of attenuation, physical strength, durability and insensitivity to frequency change. The polyiron load 40 is terminated by a metallic ring 42 which provides a short circuit at the end of line 32 and prevents the access of moisture or other foreign matter into the line.

A second branch of line 32 opposite the shorted end is connected by way of coaxial connector 44, the details of which will be set forth subsequently, to a hybrid coaxial ring sub-assembly or network 50 of mixer assembly 12. The basic outer configuration of coaxial network 50, with the coaxial line connectors not shown, appears in Fig. 2 while certain details of its construction appear in Figs. 1 and 4. This network comprises two identical segments 51 and 52 positioned back to back to form a shallow cylindrical block and held together by screws or other fastening devices (not shown). Each segment contains an annular recess or groove 53 of hemispherical cross-section. When the two halves of the block are placed together and a toroidal inner conductor 55 is supported within annular recess 56, a coaxial ring 60 is thereby formed. Inner conductor 55 of the coaxial ring may be supported by insulating beads or by quarter wave stubs, in the conventional manner.

A typical connection to the hybrid ring network 50 comprises a connector 44, shown in Fig. 1, having two threadedly engaging members 45 and 46, one of which has a recess for containing a resilient sealing ring 47. The outer member is fixedly attached to the segment 51 of coaxial ring assembly 50 as shown in Fig. 1. The inner conductor 48 of connector 44, which may be identical to the inner conductor of local oscillator injector arm 71, and which is attached firmly, as by soft soldering, to inner conductor 55 of coaxial ring 60, has a reduced portion 48' about which an insulating support 43 for inner conductor 48 is mounted. A conducting sleeve 49, one end of which is slit in the usual manner, surrounds the reduced portion 48' of conductor 48 and receives the inner conductor 31 of line 32. A tight seal is formed by tightening member 45 against sealing ring 47.

Figure 3:
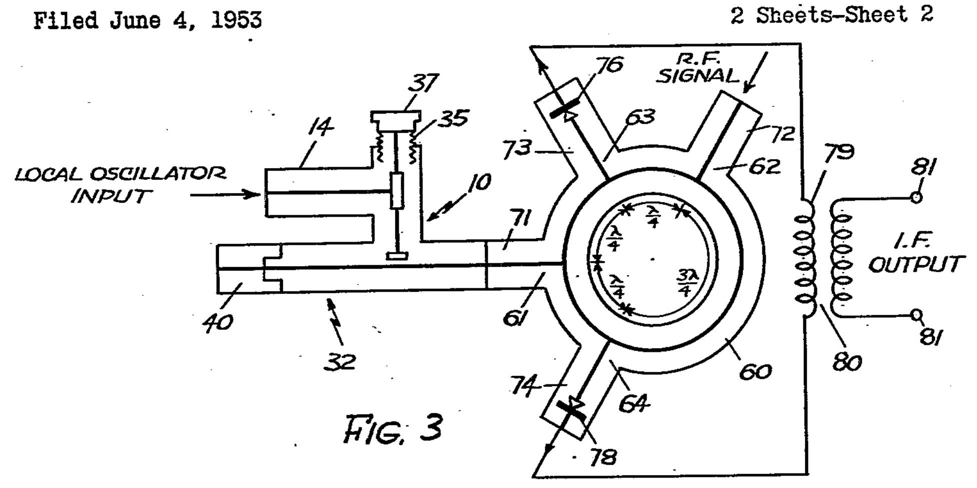
Fig. 3 is a diagrammatic view of a balanced mixer assembly according to the subject invention.

As shown schematically in Fig. 3, the closed coaxial ring 60 is one and a half wave lengths in mean circumference and includes four apertures 61 to 64 which are located at points along the periphery of the coaxial ring which are spaced some odd multiple of a quarter wave length at the operating frequency.

For the sake of clarity, in Fig. 3 the coaxial arms 71 to 74 extending from respective apertures 61 to 64 are shown as lying in the same plane as ring 60. In one practical embodiment shown in Fig. 4, coaxial arms 71 and 74 extend at right angles to the plane of the ring. Arms 71 and 72 are brought out through segment 51 of hybrid ring network 50 while arms 73 and 74 extend in the opposite direction through segment 52 of said ring. The relative angular displacement of the arm and associated apertures is identical in both Figs. 3 and 4.

In the example shown in Figs. 1 to 4, coaxial arm 71 which couples energy from the local oscillator via the injector sub-assembly 10 into the coaxial ring 60 is displaced a quarter wave length from the output arms 73 and 74. Unilateral conducting devices, such as crystal rectifiers 76 and 78, are mounted in output arms 73 and 74, respectively. These rectifiers are schematically shown in Fig. 3. The second input arm 72, which connects with coaxial transmission line 75, is receptive of an R. F. signal and may be connected to a TR cavity; this arm is positioned a quarter wave length from output arm 73 and three-quarters of a wave length from output arm 74. To complete the balanced mixer shown in Figs. 2 to 4, crystals 76 and 78 in output arms 73 and 74, respectively, may be connected to opposite ends of the primary winding 79 of an intermediate frequency transformer 80, in the usual manner. The local oscillator signals at the two crystals 76 and 78 are in phase since output arms 73 and 74 are equidistant from local oscillator injector arm 71. The received signal, on the other hand, after passing through a TR cavity, arrives at the two crystals in phase opposition since the lengths from arm 72 to arms 73 and 74 differ, respectively, by a half wave length. A balanced push-pull output is thereby produced across output terminals 81, 81, of I. F. transformer 80.

Figures 4, 5:
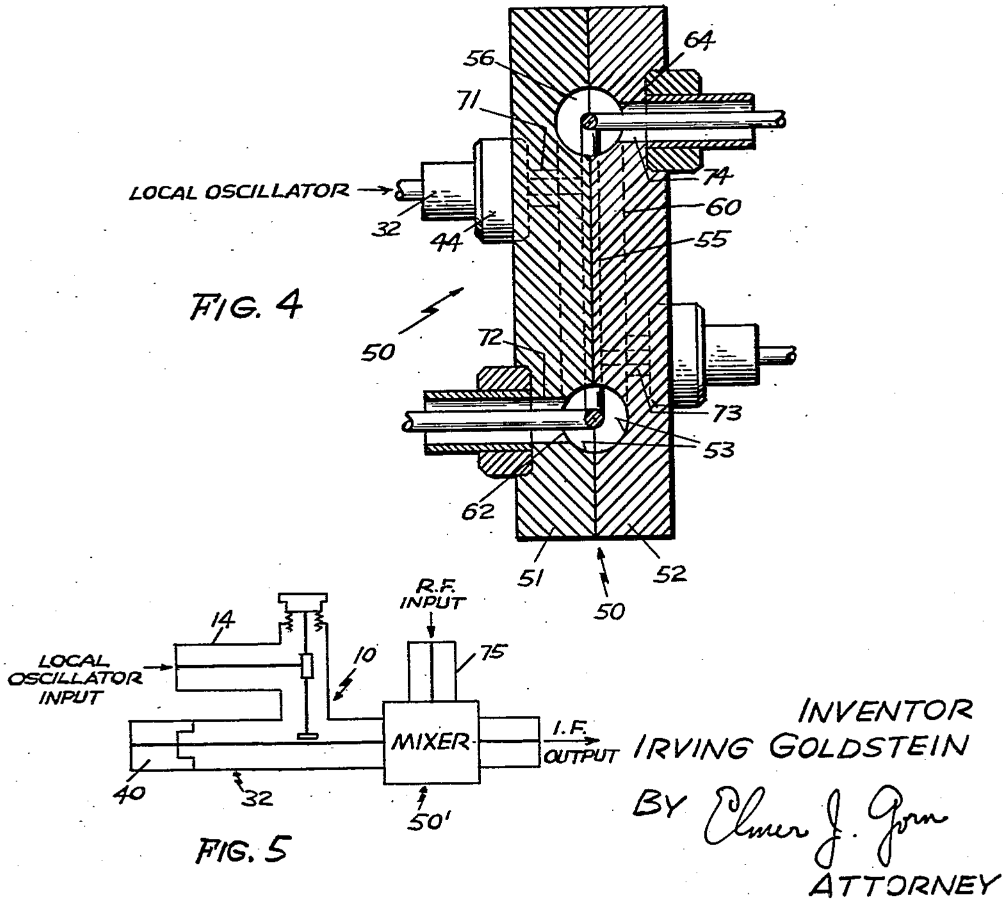
Fig. 4 is a cross-sectional view of a coaxial hybrid network used in the mixer assembly of Figs. 1 to 3.
Fig. 5 is a diagrammatic view of a simple mixer assembly as contrasted with the balanced mixer assembly of Fig. 3.

Although the explanation so far has dealt with a balance mixer, a simple mixer, such as schematically represented in Fig. 5, may be used. The output of the local oscillator injector 10 and R. F. input energy are applied to mixer 50' which consists of but a single rectifying device. Single mixers per se are well known in the art and are exemplified by the circuit shown in an application for U. S. Letters Patent of Domenichini, Ser. No. 243,691, filed August 25, 1951, now abandoned. An intermediate frequency signal is derived at the output of mixer, in the usual manner.

This invention is not limited to the particular details of construction, materials and processes described, as many equivalents will suggest themselves to those skilled in the art. It is accordingly desired that the appended claims be given a broad interpretation commensurate with the scope of the invention within the art.

What is claimed is:

1. In combination, a first coaxial transmission line including an inner conductor and an outer conductor and having first and second portions, a coaxial stub transmission line shorted at one end and having an outer conductor connected to said first transmission line at the junction of said first and second portions, said stub line including a movable inner conductor one end of which is disposed in energy coupling relationship with said first transmission line, a third coaxial transmission line connected at one end to an input transmission line which is receptive of energy from an input source and at the other end to said stub transmission line at a point which is an odd number of quarter wave lengths removed from said shorted end, an energy absorptive termination positioned in said first portion of said first coaxial transmission line, said third coaxial transmission line having incorporated therein an impedance element positioned an odd multiple of half wavelengths from said junction for providing an impedance match between said third line and the input transmission line and between the third line and the second portion of said first line.

2. In combination, a first transmission line receptive of input energy, a second transmission line connected to said first transmission line and including a movable element, a third transmission line connected to said second transmission line, an energy absorptive load contained within said third transmission line at one end thereof, the portion of the input energy at the other end of said third transmission line being a function of the position of said movable element, an impedance-matching resistive element positioned in said first transmission line substantially an odd number of half wavelengths at the operating frequency from the point of connection of said second and third lines.

3. In combination, a first transmission line receptive of input energy, a second transmission line connected to said first transmission line and including a movable element, a third transmission line connected to said second transmission line, an energy absorptive load contained within said third transmission line at one end thereof, the portion of the input energy available at the other end of said third transmission line being a function of the position of said movable element, a resistive element positioned in said first transmission line at a point substantially an odd number of half wavelengths at the operating frequency from the point of connection of said second and third lines.

4. In combination, a first transmission line receptive of input energy, a second transmission line connected to said first transmission line and including a movable element, one end of said second line being short-circuited and positioned an odd number of quarter wavelengths from the point of connection of said first and second lines, a third transmission line connected to said second transmission line, an energy absorptive load contained within said third transmission line at one end thereof, the portion of the input energy available at the other end of said third transmission line being a function of the position of said movable element, a resistive element positioned in said first transmission line at a point substantially an odd number of half wavelengths at the operating frequency from the point of connection of said second and third lines.

References Cited in the file of this patent

UNITED STATES PATENTS

| | | |
|---|---|---|
| 2,436,828 | Ring | Mar. 2, 1948 |
| 2,443,921 | Moe | June 22, 1948 |
| 2,527,979 | Woodward | Oct. 31, 1950 |
| 2,634,331 | Honda | Apr. 7, 1953 |
| 2,639,325 | Lewis | May 19, 1953 |
| 2,642,472 | McCouch | June 16, 1953 |
| 2,647,953 | Rowe | Aug. 4, 1953 |
| 2,710,346 | Schmidt | June 7, 1955 |